United States Patent
Do

(10) Patent No.: US 7,450,453 B2
(45) Date of Patent: Nov. 11, 2008

(54) SEMICONDUCTOR MEMORY DEVICE AND METHOD FOR DRIVING BIT LINE SENSE AMPLIFIER THEREOF

(75) Inventor: Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 107 days.

(21) Appl. No.: 11/322,041

(22) Filed: Dec. 28, 2005

(65) Prior Publication Data

US 2007/0070752 A1 Mar. 29, 2007

(30) Foreign Application Priority Data

Sep. 29, 2005 (KR) .................. 10-2005-0091521

(51) Int. Cl.
*G11C 7/00* (2006.01)
(52) U.S. Cl. .................. 365/205; 365/207; 365/96
(58) Field of Classification Search .................. 365/205, 365/207, 208, 189.09
See application file for complete search history.

(56) References Cited

U.S. PATENT DOCUMENTS

| | | | |
|---|---|---|---|
| 5,416,734 A | 5/1995 | Hidaka et al. | |
| 5,475,642 A | 12/1995 | Taylor | |
| 5,949,723 A | 9/1999 | Clemen et al. | |
| 6,242,942 B1 * | 6/2001 | Shamarao | .................. 326/27 |
| 6,327,201 B2 | 12/2001 | Dean | |
| 6,437,600 B1 * | 8/2002 | Keeth | .................. 326/86 |
| 6,466,487 B1 * | 10/2002 | Otsuka | .................. 365/189.05 |
| 6,603,689 B2 * | 8/2003 | Kato et al. | .................. 365/200 |
| 6,624,662 B1 * | 9/2003 | Volk | .................. 326/87 |
| 6,873,559 B2 * | 3/2005 | Ueda | .................. 365/205 |
| 7,071,728 B2 * | 7/2006 | Chandler et al. | .................. 326/30 |
| 2006/0033532 A1 * | 2/2006 | Watt | .................. 326/87 |

FOREIGN PATENT DOCUMENTS

| | | |
|---|---|---|
| JP | 10-232266 | 9/1998 |
| JP | 11-126483 | 11/1999 |
| JP | 2000-285672 | 10/2000 |
| JP | 2002-313099 | 10/2002 |
| JP | 2002-353597 | 12/2002 |
| KR | 1999-008567 | 2/1999 |
| KR | 2003-0086111 | 11/2003 |

* cited by examiner

*Primary Examiner*—Van Thu Nguyen
*Assistant Examiner*—Han Yang
(74) *Attorney, Agent, or Firm*—Blakely, Sokoloff, Taylor & Zafman

(57) ABSTRACT

A semiconductor memory device includes an amplifying unit for amplifying a voltage difference between a bit line pair; a power supply driver for supplying a power to the amplifying unit in response to a second driving signal; a control unit for generating a first driving signal of the power supply driver in response to an amplifying unit enable signal; a selection signal generation unit for generating a plurality of selection signals for determining a turning-on transition speed of the power supply driver; and a power supply driver driving unit for generating the second driving signal according to the first driving signal and the plurality of selection signals.

23 Claims, 5 Drawing Sheets

SEMICONDUCTOR MEMORY DEVICE AND METHOD FOR DRIVING BIT LINE SENSE AMPLIFIER THEREOF

FIELD OF INVENTION

The present invention relates to a semiconductor memory device; and, more particularly, to a semiconductor memory device and a method of operating the semiconductor memory device for controlling an amplifying speed of a bit line sense amplifier according to a state of a chip by controlling a supplying ability of an amplifying power supply voltage.

DESCRIPTION OF PRIOR ART

Generally, a dynamic random access memory (DRAM) includes a cell array having a plurality of unit cells for storing data. For accessing a data stored in a unit cell, the data should be amplified by a bit line sense amplifier included in a bit line sense amplifier array. Herein, a control circuit is provided in the DRAM for controlling a switch which supplies a power supply voltage when the bit line sense amplifier performs an amplifying operation.

FIG. 1 is a block diagram showing a conventional semiconductor memory device.

As shown, the semiconductor memory device includes a bit line sense amplifier (BLSA) 101, an RTO driver 102a, an SB driver 102b, an RTO driver driving unit 103a, an SB driver driving unit 103b and a control unit 104.

The bit line sense amplifier 101 amplifies a voltage difference between a bit line pair. The RTO driver 102a and the SB driver 102b supply an electric power to the bit line sense amplifier 101. The RTO driver driving unit 103a and the SB driver driving unit 103b respectively drive the RTO driver 102a and the SB driver 102b. The control unit 104 controls the RTO driver driving unit 103a and the SB driver driving unit 103b in response to a bit line sense amplifier enable signal SAEN.

An amplifying operation of the bit line sense amplifier 101 is briefly described below.

If an active command is inputted to the semiconductor memory device, a corresponding word line (WL) is activated according to an inputted external address. Then, a charge stored in a unit cell is shared by a bit line (BL) and, thus, a voltage is loaded between both terminals SA and SAb of a cross couple amplifying unit of the bit line sense amplifier 101. Thereafter, after being delayed for a predetermined time by the active command, the bit line sense amplifier enable signal SAEN is generated. In synchronization with the bit line sense amplifier enable signal SAEN, an RTOENB signal and an SBEN signal for respectively controlling the RTO driver 102a and the SB driver 102b are activated to thereby drive the RTO driver 102a and the SB driver 102b and, thus, an RTO node has a voltage level of a power supply voltage VDD and an SB node has a voltage level of a ground voltage VSS.

At this time, since the RTO node and the SB node respectively have a voltage level of the power supply voltage VDD and a voltage level of the ground voltage VSS, a small voltage difference of the terminals SA and SAb is amplified to the ground voltage VSS and the power supply voltage VDD by a positive feedback operation of a cross couple. Generally, the faster this amplifying operation is performed, the better the performance of the semiconductor memory device is.

Meanwhile, an amplifying characteristic of the SA and SAb is directly affected by a voltage transition characteristic of the RTO node and the SB node. Herein, the voltage transition characteristic of the RTO node and the SB node is determined by a driving ability of the RTO driver 102a and the SB driver 102b.

If the RTO driver 102a and the SB driver 102b are controlled to be turned-on very fast, i.e., if a gate signal of the RTO driver 102a and the SB driver 102b is controlled to have a steep slop, for increasing the amplifying speed, an operation timing and a fully turned-on state of the RTO driver 102a and the SB driver 102b can be advanced. However, in this case, a resistant voltage drop of the power supply voltage VDD and the ground voltage VSS is generated due to a rapid current consumption and a current flow is hindered due to an inductance component of a supplying line of the power supply voltage VDD and the ground voltage VSS. Accordingly, these phenomena degrade the amplifying speed. Also, the voltage drop may cause an abnormal operation of a peripheral circuit.

On the contrary, if the RTO driver 102a and the SB driver 102b are controlled to be slowly turned-on, a stability of the amplifying operation can be improved. However, in this case, the performance of the semiconductor memory device is degraded since the amplifying speed is decreased.

FIGS. 2a and 2b are timing diagrams showing the amplifying operation of the semiconductor memory device shown in FIG. 1.

FIG. 2a shows the amplifying operation when the RTOENB signal and the SBEN signal are steeply transitioned for improving the amplifying speed. As shown, the amplification characteristic of the SA and SAb is degraded due to the above-mentioned voltage drop caused by the rapid current consumption (IR drop) and the above-mentioned current flow hindrance caused by the inductance component.

FIG. 2a shows the amplifying operation when the RTOENB signal and the SBEN signal are slowly transitioned for securing a stable operation of the semiconductor memory device. As shown, even though the above-mentioned problems such as the voltage drop are prevented, the amplification of the SA and SAb is slowly performed and, thus, the performance of the semiconductor memory device is degraded.

However, according to the conventional semiconductor memory device, the amplification characteristic according to the transition characteristic of the control signals for controlling the RTO driver 102a and the SB driver 102b cannot be detected, and the transition characteristic of the control signals cannot be adjusted for an optimum transition characteristic.

SUMMARY OF INVENTION

It is, therefore, an object of the present invention to provide a semiconductor memory device for adjusting an amplification characteristic according to a state of a chip by controlling a power supplier of a bit line sense amplifier in order to optimize the chip and applies the adjusted result to the chip at a real-time.

In accordance with an aspect of the present invention, there is provided a semiconductor memory device, including: an amplifying unit for amplifying a voltage difference between a bit line pair; a power supply driver for supplying a power to the amplifying unit in response to a second driving signal; a control unit for generating a first driving signal of the power supply driver in response to an amplifying unit enable signal; a selection signal generation unit for generating a plurality of selection signals for determining a turning-on transition speed of the power supply driver; and a power supply driver driving unit for generating the second driving signal according to the first driving signal and the plurality of selection signals.

In accordance with another aspect of the present invention, there is provided a semiconductor memory device, including: an amplifying unit for amplifying a voltage difference between a bit line pair; a first power supply driver for supplying a first power supply voltage to the amplifying unit; a second power supply driver for supplying a second power supply voltage to the amplifying unit; a control unit for generating a first driving signal of the first power supply driver and a first driving signal of the second power supply driver in response to an amplifying unit enable signal; a first selection signal generation unit for generating a plurality of first selection signals for determining a turning-on transition speed of the first power supply driver; a second selection signal generation unit for generating a plurality of second selection signals for determining a turning-on transition speed of the second power supply driver; a first power supply driver driving unit for generating a second driving signal of the first power supply driver according to the first driving signal of the first power supply driver and the plurality of first selection signals and for supplying the second driving signal to the first power supply driver; and a second power supply driver driving unit for generating a second driving signal of the second power supply driver according to the first driving signal of the second power supply driver and the plurality of second selection signals and for supplying the second driving signal to the second power supply driver.

In accordance with further another aspect of the present invention, there is provided a method for operating a semiconductor memory device, including the steps of: a) generating a first driving signal in response to an amplifying unit enable signal; b) generating a plurality of first selection signals for determining a turning-on transition speed of a first power supply driver which supplies a first power supply voltage to an amplifying unit and generating a plurality of second selection signals for determining a turning-on transition speed of a second power supply driver which supplies a second power supply voltage to the amplifying unit; c) supplying a second driving signal of the first power supply driver to the first power supply driver in response to the first driving signal and the plurality of first selection signals and supplying a second driving signal of the second power supply driver to the second power supply driver in response to the first driving signal and the plurality of second selection signals; d) supplying the first and the second power supply voltages to the amplifying unit; and e) amplifying a voltage difference between a bit line pair.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
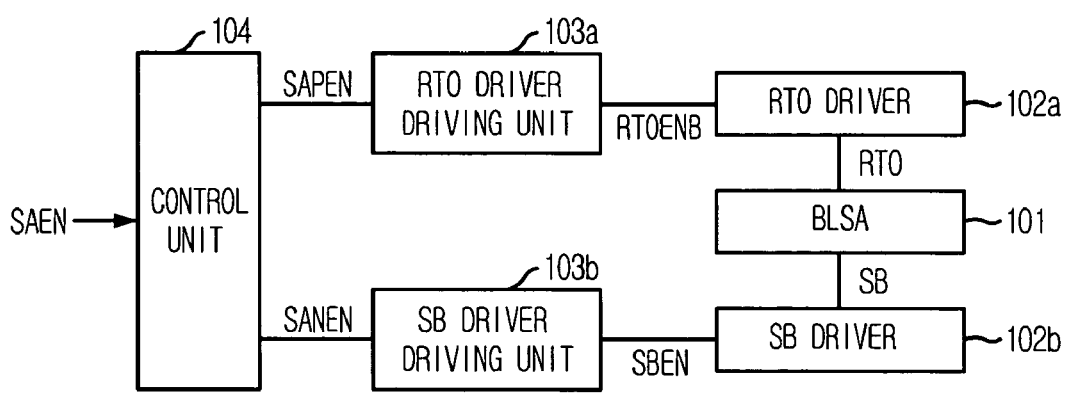
FIG. 1 is a block diagram showing a conventional semiconductor memory device.
Figure 2A:
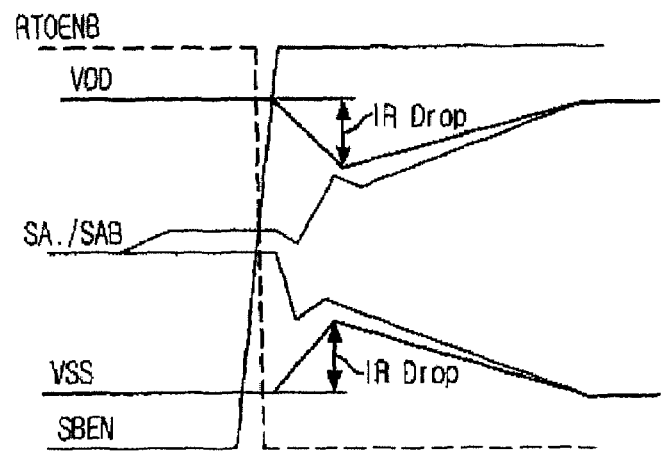
FIGS. 2a and 2b are timing diagrams showing an amplifying operation of the semiconductor memory device shown in FIG. 1.
Figure 2B:
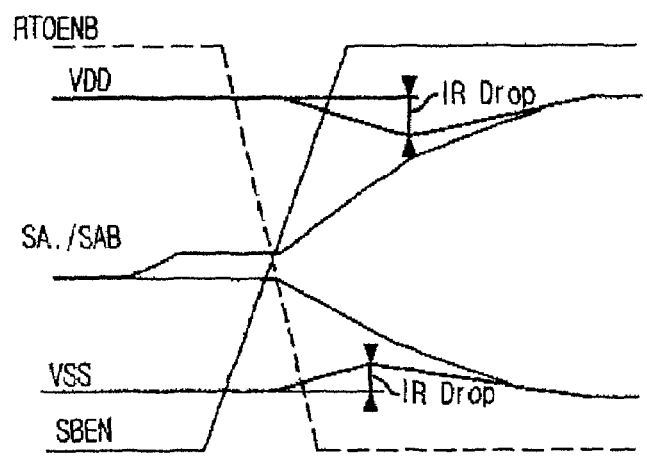
Figure 3:
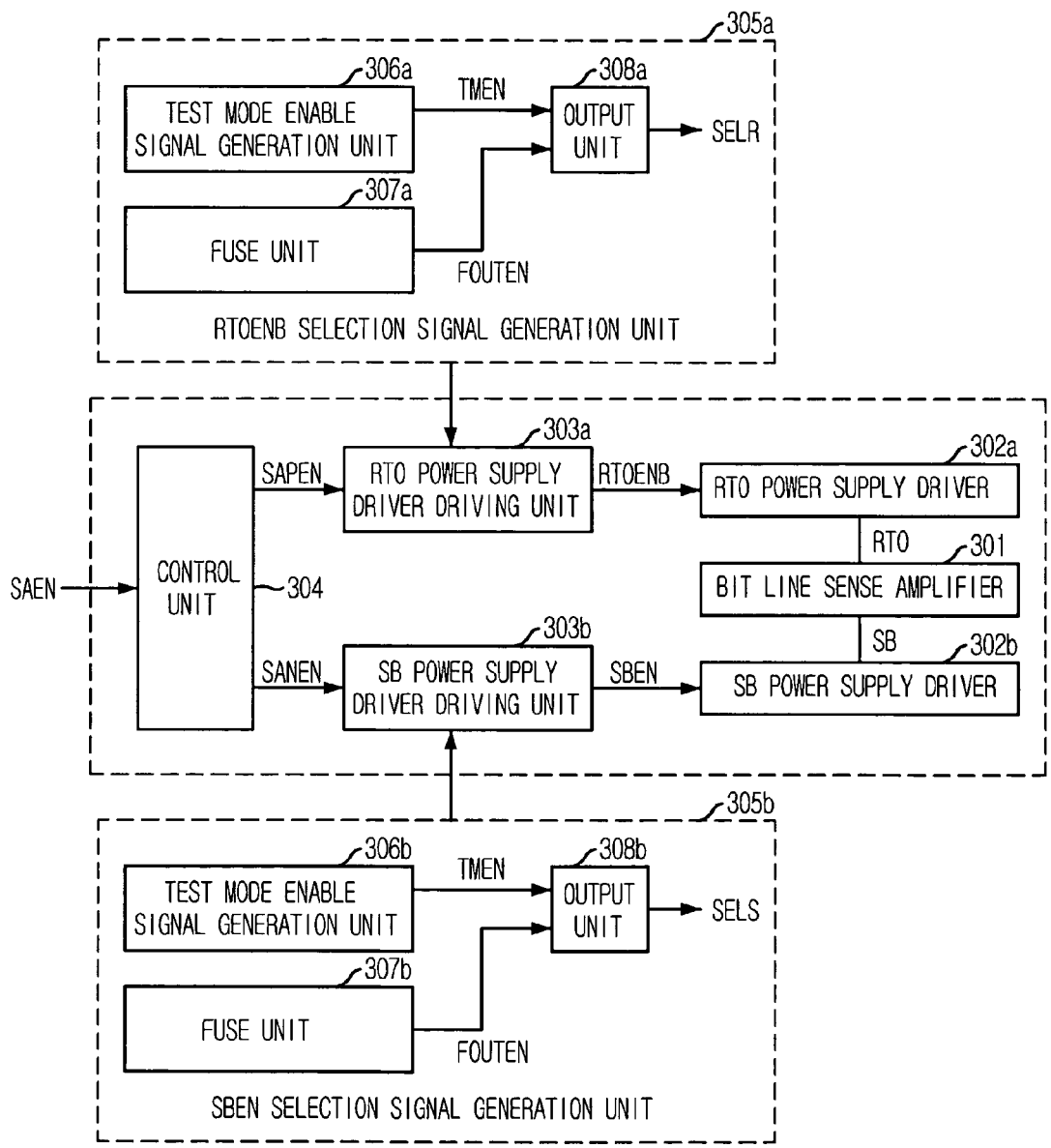
FIG. 3 is a block diagram showing a semiconductor memory device in accordance with a preferred embodiment of the present invention.

FIG. 3 is a block diagram showing a semiconductor memory device in accordance with a preferred embodiment of the present invention.

As shown, the semiconductor memory device includes a bit line sense amplifier 301, an RTO power supply driver 302a, an SB power supply driver 302b, a control unit 304, an RTOENB selection signal generation unit 305a, an SBEN selection signal generation unit 305b, an RTO power supply driver driving unit 303a and an SB power supply driver driving unit 303b.

The bit line sense amplifier 301 amplifies a voltage difference between a bit line pair. The RTO power supply driver 302a supplies a first power supply voltage VDD to the bit line sense amplifier 301 and the SB power supply driver 302b supplies a second power supply voltage VSS to the bit line sense amplifier 301. The control unit 304 generates a first driving signal SAPEN of the RTO power supply driver 302a and a first driving signal SANEN of the SB power supply driver 302b in response to a bit line sense amplifier enable signal SAEN.

The RTOENB selection signal generation unit 305a generates a plurality of first selection signals SELR for determining a turning-on transition slope, i.e., a turning-on speed, of the RTO power supply driver 302a. Similarly, the SB selection signal generation unit 305b generates a plurality of second selection signals SELS for determining a turning-on transition slope of the SB power supply driver 302a.

The RTO power supply driver driving unit 303a generates a second driving signal RTOENB of the RTO power supply driver 302a according to the first driving signal SAPEN of the RTO power supply driver 302a and the plurality of first selection signals SELR. Similarly, the SB power supply driver driving unit 303b generates a second driving signal SBEN of the SB power supply driver 302b according to the first driving signal SANEN of the SB power supply driver 302b and the plurality of second selection signals SELS.

In detail, the RTO power supply driver driving unit 303a includes a test mode enable signal generation unit 306a, a fuse unit 307a and an output unit 308a.

The test mode enable signal generation unit 306a generates a test mode enable signal TMEN for performing a test operation. The fuse unit 307a generates a fuse signal FOUTEN according to whether a fuse is cut. The output unit 308a generates the first selection signal SELR in order to activate the first selection signal SELR when one of the test mode enable signal TMEN and the fuse signal FOUTEN is activated.

Herein, the fuse signal FOUTEN is activated by a fuse cutting of the fuse unit 307a. The output unit 308a includes a NOR gate for receiving the test mode enable signal TMEN and the fuse signal FOUTEN and an inverter for inverting an output of the NOR gate to thereby generate the first selection signal SELR.

Meanwhile, a structure of the SB power supply driver 305b is same to that of the RTO power supply driver 305a except that the SB power supply driver generates the second selection signal SELS.

Referring to FIG. 3, an operation of the semiconductor memory device is described below.

The control unit 304 generates the first driving signals SAPEN and SANEN in response to the bit line sense amplifier enable signal SAEN. The plurality of first selection signals SELR are generated to control the turning-on transition slope of the RTO power supply driver 302a for supplying the first power supply voltage VDD to the bit line sense amplifier 301. Likewise, the plurality of second selection signals SELS are generated to control the turning-on transition slope of the SB power supply driver 302b for supplying the second power supply voltage VSS to the bit line sense amplifier 301.

Thereafter, the second driving signal RTOENB of the RTO power supply driver 302a is generated by the RTO power supply driver driving unit 303a according to the first driving signal SAPEN and the plurality of first selection signals SELR and, likewise, the second driving signal SBEN of the SB power supply driver 302b is generated by the SB power supply driver driving unit 303b according to the first driving signal SANEN and the plurality of second selection signals SELS.

Thereafter, in response to the second driving signals RTOENB and SBEN, the RTO power supply driver 302a and the SB power supply driver 302b respectively supply the first and the second power supply voltages to the bit line sense amplifier 301. Accordingly, the bit line sense amplifier 301 amplifies a voltage difference between a bit line pair by using the first and the second power supply voltages. Herein, the first power supply voltage is a power supply voltage VDD and the second power supply voltage is a ground voltage VSS.

Figure 4A:
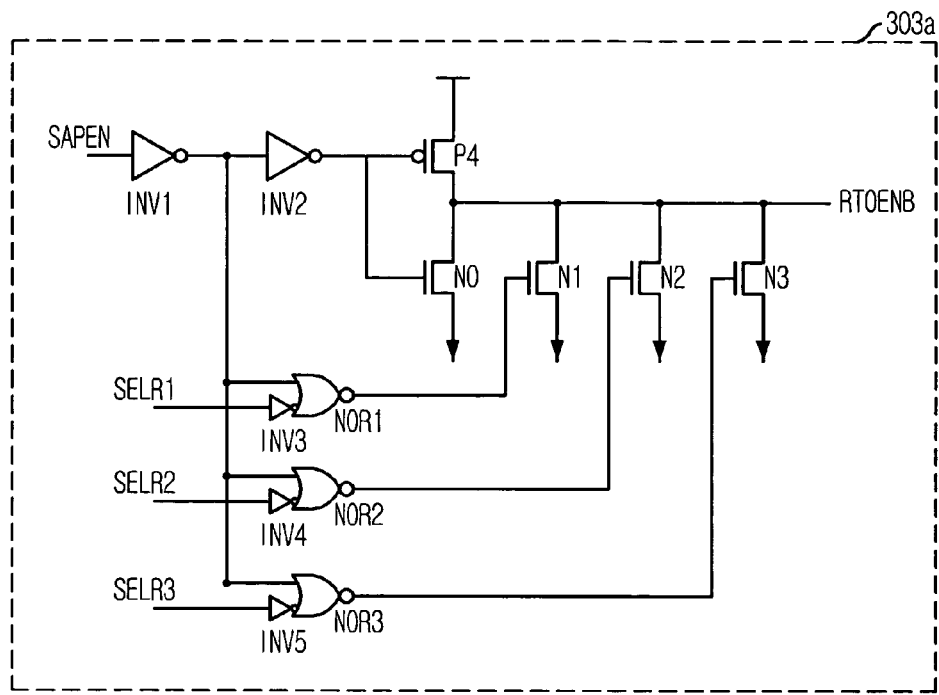
FIGS. 4a and 4b are schematic circuit diagrams respectively showing the RTO power supply driver driving unit and the SB power supply driver driving unit shown in FIG. 3.
Figure 4B:
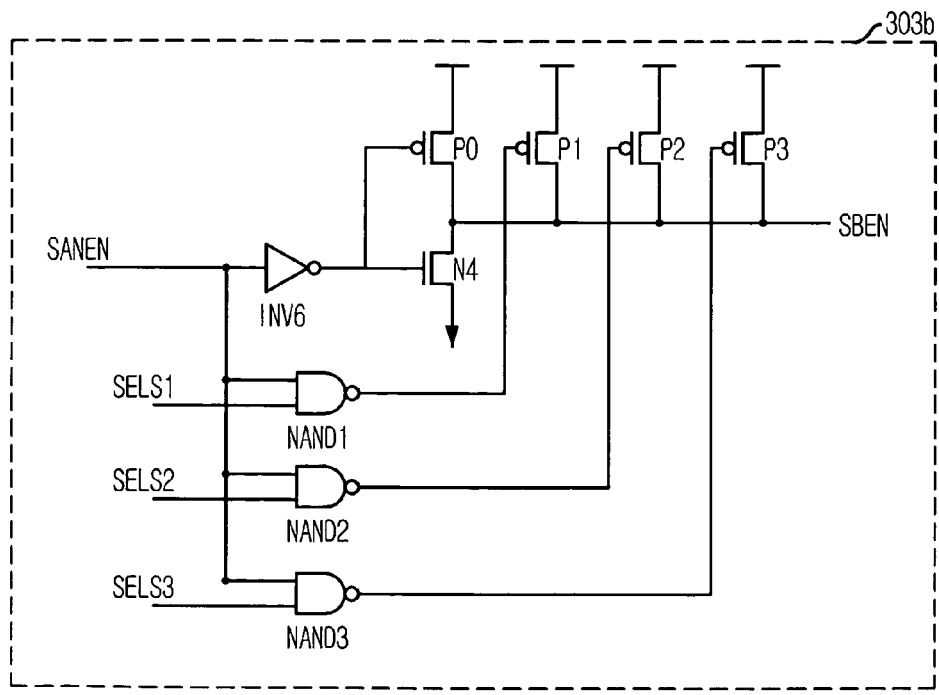

FIGS. 4a and 4b are schematic circuit diagrams respectively showing the RTO power supply driver driving unit 303a and the SB power supply driver driving unit 303b shown in FIG. 3.

As shown, the RTO power supply driver driving unit 303a includes a first to a fifth inverters INV1 to INV5, a first to a third NOR gates NOR1 to NOR3, a fifth p-type metal oxide semiconductor (PMOS) transistor P4 and a first to a fourth n-type metal oxide semiconductor (NMOS) transistors N0 to N3.

The first inverter INV1 receives the first driving signal SAPEN and the second inverter INV2 receives an output of the first inverter INV1. The third to the fifth inverters INV3 to INV5 respectively receive a plurality of first selection signals SELR1 to SELR3.

The first NOR gate NOR1 performs a logic NOR operation to an output of the first inverter INV1 and an output of the third inverter INV3. The second NOR gate NOR2 performs a logic NOR operation to the output of the first inverter INV1 and an output of the fourth inverter INV4. Similarly, the third NOR gate NOR3 performs a logic NOR operation to the output of the first inverter INV1 and an output of the fifth inverter INV5. Herein, the number of the third to the fifth inverters INV3 to INV5 and the number of the first to the third NOR gates NOR1 to NOR3 are corresponds to the number of the plurality of first selection signals.

Each gate of the fifth PMOS transistor P4 and the first NMOS transistor N0 receives an output of the second inverter INV2. Gates of the second to the fourth NMOS transistors N1 to N3 respectively receive each output of the first to the third NOR gates NOR1 to NOR3. The fifth PMOS transistor P4 and the first to the fourth NMOS transistors N0 to N3 are coupled to a common node. Herein, the fifth PMOS transistor P4 and the first to the fourth NMOS transistors N0 to N3 are operated as a pull-down driver.

An operation of the RTO power supply driver driving unit 303a is described below.

For instance, when the first driving signal SAPEN is inputted to the RTO power supply driver driving unit 303a as a logic high level, the first NMOS transistor N0 is turned on. Accordingly, the second driving signal RTOENB is transitioned to a logic low level. At this time, if one of the plurality of first control signals SELR1 is inputted as a logic high level, the second NMOS transistor N1 is turned-on by the output of the first NOR gate NOR1. Accordingly, a transition speed of the second driving signal RTOENB is increased, i.e., the second driving signal RTOENB is changed to a logic low level more quickly. In this manner, the transition speed of the second driving signal RTOENB is more increased by turning on the third and the fourth NMOS transistors N2 and N3.

Meanwhile, the SB power supply driver driving unit 303b includes a sixth inverter INV6, a fifth NMOS transistor N4, a first to a third NAND gates NAND1 to NAND3 and a first to a fourth PMOS transistors P0 to P3.

The first to the third NAND gates NAND1 to NAND3 respectively receive a plurality of second selection signals SELS1 to SELS3 and each of the first to the third NAND gates NAND1 to NAND3 further receives the first driving signal SANEN. Herein, the number of the first to the third NAND gates NAND1 to NAND3 is same to the number of the plurality of second selection signals SELS1 to SELS3.

The sixth inverter INV6 receives the first driving signal SANEN and each gate of the first PMOS transistor P0 and the fifth NMOS transistor N4 receives an output of the sixth inverter INV6. Gates of the second to the fourth PMOS transistors P1 to P3 respectively receive outputs of the first to the third NAND gates NAND1 to NAND3. The fifth NMOS transistor N4 and the first to the fourth PMOS transistors are coupled to a common output node. Herein, the fifth NMOS transistor N4 and the first to the fourth PMOS transistors are operated as a pull-up driver.

An operation of the SB power supply driver driving unit 303b is described below.

For instance, when the first driving signal SANEN is inputted to the SB power supply driver driving unit 303b as a logic high level, the first PMOS transistor P0 is turned-on by the output of the sixth inverter INV6. Accordingly, the second driving signal SBEN is transitioned to a logic high level by the first PMOS transistor P0.

At this time, if one of the plurality of second selection signals SELS1 is inputted as a logic high level, the second PMOS transistor P1 is turned-on by the output of the first NAND gate NAND1. Accordingly, a transition speed of the second driving signal SBEN is increased, i.e., the second driving signal SBEN is changed to a logic high level more quickly. In this manner, the transition speed of the second driving signal SBEN is more increased by turning on the third and the fourth PMOS transistors P2 and P3.

Figure 5A:
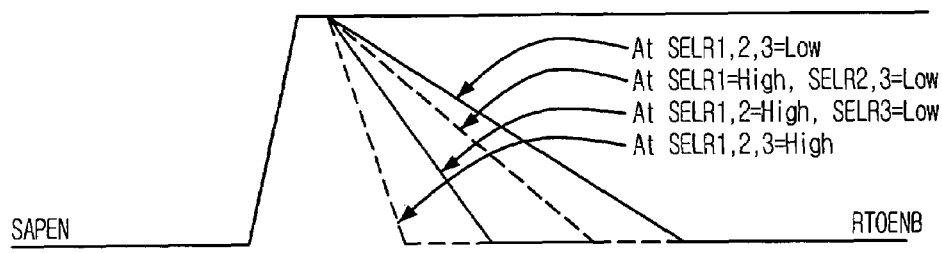
FIGS. 5a and 5b are wave diagrams respectively showing the transition characteristics of the second driving signals.
Figure 5B:
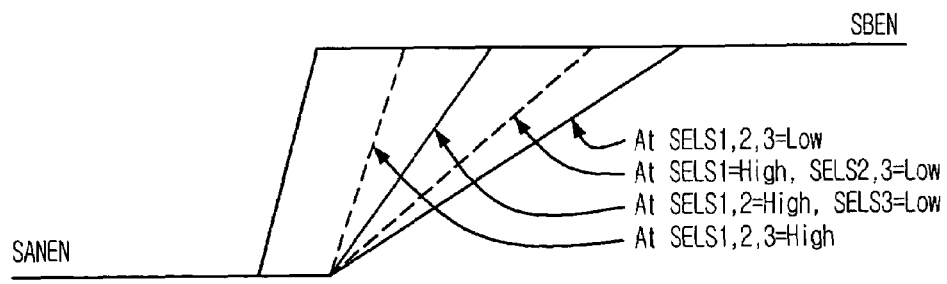

FIGS. 5a and 5b are wave diagrams respectively showing the transition characteristics of the second driving signals RTOENB and SBEN.

Referring to FIG. 5a, the transition characteristic of the second driving signal RTOENB is changed according to each logic state of the plurality of first selection signals SELR1 to SELR3.

When all of selection signals SELR1 to SELR3 are in a logic low level, the second driving signal RTOENB has the gentlest transition slope. On the contrary, when all of selection signals SELR1 to SELR3 are in a logic high level, a transition slope of the second driving signal RTOENB is the steepest.

Referring to FIG. 5b, the transition characteristic of the second driving signal SBEN is changed according to each logic state of the plurality of second selection signals SELS1 to SELS3.

When all of the second selection signals SELS1 to SELS3 are in a logic low level, the second driving signal SBEN has the gentlest transition slope. On the contrary, when all of second selection signals SELS1 to SELS3 are in a logic high level, a transition slope of the second driving signal SBEN is the steepest.

Meanwhile, at the test mode, the above-mentioned monitoring operation can be performed for an optimum operation of the semiconductor memory device, and the monitoring result can be applied to the semiconductor memory device at a real-time by the fuse cutting.

Therefore, in accordance with the present invention, by appropriately adjusting an amplifying characteristic of a sense amplifier, a semiconductor memory device can be operated at a high speed and with a high stability. Further, since the monitoring result can be applied to the semiconductor memory device at a real-time during the test mode, the semiconductor memory device can be efficiently manufactured.

The present application contains subject matter related to Korean patent application No. 2005-91521, filed in the Korean Patent Office on, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   an amplifying unit for amplifying a voltage difference between a bit line pair;
   a power supply driver for supplying a power to the amplifying unit in response to a second driving signal;
   a control unit for generating a first driving signal of the power supply driver in response to an amplifying unit enable signal;
   a selection signal generation unit for generating a plurality of selection signals for determining a turning-on transition speed of the power supply driver;
   a power supply driver driving unit for generating the second driving signal according to the first driving signal and the plurality of selection signals;
   wherein the power supply driver driving unit includes;
   a plurality of logic combination units, each logic combination unit performing a logic operation with a corresponding selection signal and the first driving signal; and
   a power driving unit for receiving the first driving signal to drive an output node,
   wherein the selection signal generation unit includes:
   a test mode enable signal generation unit for generating a test mode enable signal in order to perform a test operation;
   a fuse unit for generating a fuse signal according to cutting or not cutting of a fuse; and
   an output unit for activating the plurality of selection signals when at least one of the test mode enable signal and the fuse signal is activated.

2. The semiconductor memory device as recited in claim 1, wherein the power supply driver driving unit includes:
   the output node for outputting the second driving signal; and
   a plurality of drivers for driving the output node according to outputs of the plurality of logic combination units.

3. The semiconductor memory device as recited in claim 2, wherein the plurality of drivers includes:
   a first driver driven by the first driving signal; and
   at least one second driver driven according to the first driving signal and each logic state of the plurality of selection signals.

4. The semiconductor memory device as recited in claim 1, wherein the fuse signal is activated by a fuse cutting of the fuse unit.

5. A semiconductor memory device, comprising:
   an amplifying unit for amplifying a voltage difference between a bit line pair;
   a first power supply driver for supplying a first power supply voltage to the amplifying unit;
   a second power supply driver for supplying a second power supply voltage to the amplifying unit;
   a control unit for generating a first driving signal of the first power supply driver and a first driving signal of the second power supply driver in response to an amplifying unit enable signal;
   a first selection signal generation unit for generating a plurality of first selection signals for determining a turning-on transition speed of the first power supply driver;
   a second selection signal generation unit for generating a plurality of second selection signals for determining a turning-on transition speed of the second power supply driver;
   a first power supply driver driving unit for generating a second driving signal of the first power supply driver according to the first driving signal of the first power supply driver and the plurality of first selection signals and for supplying the second driving signal to the first power supply driver, wherein the first power supply driver driving unit includes a plurality of first logic combination units, each of the first logic combination units performing a logic operation with a corresponding first selection signal and the first driving signal of the first power supply driver, and a first power driving unit for receiving the first driving signal of the first power supply driver to drive a first output node; and
   a second power supply driver driving unit for generating a second driving signal of the second power supply driver according to the first driving signal of the second power supply driver and the plurality of second selection signals and for supplying the second driving signal to the second power supply driver,
   wherein the second power supply driver driving unit includes a plurality of second logic combination units, each of the second logic combination units performing a logic operation with a corresponding second selection signal and the first driving signal of the second power supply driver, and a second power driving unit for receiving the first driving signal of the second power supply driver to drive a second output node,
   wherein the first selection signal generation unit includes:
   a test mode enable signal generation unit for generating a test mode enable signal in order to perform a test operation;
   a fuse unit for generating a fuse signal according to cutting or not cutting of a fuse; and
   an output unit for activating the first selection signal when at least one of the test mode enable signal and the fuse signal is activated.

6. The semiconductor memory device as recited in claim 5, wherein the first power supply driver driving unit includes:
   the first output node for outputting the second driving signal of the first power supply driver; and
   a plurality of pull-down drivers for driving the first output node according to outputs of the plurality of first logic combination units.

7. The semiconductor memory device as recited in claim 6, wherein the plurality of pull-down drivers includes:

a first pull-down driver driven by the first driving signal of the first power supply driver; and at least one second pull-down driver driven according to the first driving signal of the first power supply driver and each logic state of the plurality of first selection signals.

8. The semiconductor memory device as recited in claim 5, wherein the second power supply driver driving unit includes:

the second output node for outputting the second driving signal of the second power supply driver; and a plurality of pull-up drivers for driving the second output node according to outputs of the plurality of second logic combination units.

9. The semiconductor memory device as recited in claim 8, wherein the plurality of pull-up drivers includes:

a first pull-up driver driven by the first driving signal of the second power supply driver; and at least one second pull-up driver driven according to the first driving signal of the second power supply driver and each logic state of the plurality of second selection signals.

10. The semiconductor memory device as recited in claim 5, wherein the fuse signal is activated by a fuse cutting of the fuse unit.

11. The semiconductor memory device as recited in claim 5, wherein the second selection signal generation unit includes:

a test mode enable signal generation unit for generating a test mode enable signal in order to perform a test operation;

a fuse unit for generating a fuse signal according to cutting or not cutting of a fuse; and an output unit for activating the second selection signal when at least one of the test mode enable signal and the fuse signal is activated.

12. The semiconductor memory device as recited in claim 11, wherein the fuse signal is activated by a fuse cutting of the fuse unit.

13. The semiconductor memory device as recited in claim 5, wherein the first power supply voltage is a power supply voltage (VDD) of the semiconductor memory device.

14. The semiconductor memory device as recited in claim 5, wherein the second power supply voltage is a ground voltage (VSS).

15. The semiconductor memory device as recited in claim 5, wherein the first power supply driver driving unit includes:

a first inverter for receiving the first driving signal of the first power supply driver;

a second inverter for receiving an output of the first inverter;

a plurality of third inverters for respectively receiving the plurality of first selection signals;

a plurality of NOR gates for respectively receiving outputs of the plurality of third inverters and the output of the first inverter;

a PMOS transistor for receiving an output of the second inverter through a gate of the PMOS transistor;

a first NMOS transistor for receiving an output of the second inverter through a gate of the first NMOS transistor;

a plurality of second NMOS transistors whose gates respectively receive outputs of the plurality of NOR gates; and an output node commonly coupled by the PMOS transistor, the first and the plurality of second NMOS transistors.

16. The semiconductor memory device as recited in claim 15, wherein each number of the third inverters, the NOR gates and the second NMOS transistors is equal to the number of the plurality of first selection signals.

17. The semiconductor memory device as recited in claim 5, wherein the second power supply driver driving unit includes:

a plurality of NAND gates for respectively receiving the plurality of second selection signals and the first driving signal of the second power supply driver;

an inverter for receiving the first driving signal of the second power supply driver;

an NMOS transistor for receiving an output of the inverter through a gate of the NMOS transistor;

a first PMOS transistor for receiving the output of the inverter through a gate of the first PMOS transistor;

a plurality of second PMOS transistors whose gates respectively receive outputs of the plurality of NAND gates; and an output node commonly coupled by the NMOS transistor, the first and the plurality of second PMOS transistors.

18. The semiconductor memory device as recited in claim 17, wherein each number of the NAND gates and the plurality of second PMOS transistors is equal to the number of the plurality of second selection signals.

19. The semiconductor memory device as recited in claim 5, wherein the output unit includes:

a NOR gate for receiving the test mode enable signal and the fuse signal; and an inverter for inverting an output of the NOR gates to thereby generate the first selection signal.

20. The semiconductor memory device as recited in claim 11, wherein the output unit includes:

a NOR gate for receiving the test mode enable signal and the fuse signal; and an inverter for inverting an output of the NOR gates to thereby generate the second selection signal.

21. A method for operating a semiconductor memory device, comprising the steps of:

a) generating a first driving signal in response to an amplifying unit enable signal;

b) generating a plurality of first selection signals for determining a turning-on transition speed of a first power supply driver which supplies a first power supply voltage to an amplifying unit and generating a plurality of second selection signals for determining a turning-on transition speed of a second power supply driver which supplies a second power supply voltage to the amplifying unit, wherein the first selection signals and the second selection signals are activated respectively when at least one of a test mode enable signal and a fuse signal is activated;

c) generating a plurality of second selection signals for determining a turning-on transition speed of a second power supply driver which supplies a second power supply voltage to the amplifying unit;

d) performing a plurality of logic operations, each of the plurality of logic operations performing with corresponding one of the first selection signals and the first driving signal;

e) performing a plurality of logic operations, each of the plurality of logic operations performing with corresponding one of the second selection signals and the first driving signal;

f) supplying a second driving signal of the first power supply driver to the first power supply driver in response to the first driving signal and the plurality of first selection signals and supplying a second driving signal of the second power supply driver to the second power supply driver in response to the first driving signal and the plurality of second selection signals;

g) supplying the first and the second power supply voltages to the amplifying unit; and h) amplifying a voltage difference between a bit line pair.

22. The method as recited in claim 21, wherein the first the first power supply voltage is a power supply voltage (VDD) of the semiconductor memory device.

23. The semiconductor memory device as recited in claim 21, wherein the second power supply voltage is a ground voltage (VSS).

* * * * *